US012640194B2

(12) United States Patent

Jain

(10) Patent No.: US 12,640,194 B2

(45) Date of Patent: May 26, 2026

(54) MEMORY DEVICE AND DATA LATCHING METHOD

(71) Applicant: Taiwan Semiconductor Manufacturing Company, Ltd., Hsinchu (TW)

(72) Inventor: Sanjeev Kumar Jain, Ottawa (CA)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 174 days.

(21) Appl. No.: 18/344,819

(22) Filed: Jun. 29, 2023

(65) Prior Publication Data

US 2025/0006257 A1     Jan. 2, 2025

(51) Int. Cl.
*G11C 11/419* (2006.01)

(52) U.S. Cl.
CPC .................................. *G11C 11/419* (2013.01)

(58) Field of Classification Search
CPC ..................................................... G11C 11/419
USPC ......................................................... 365/154
See application file for complete search history.

(56) References Cited

U.S. PATENT DOCUMENTS

| | | | | |
|---|---|---|---|---|
| 7,391,250 B1 * | 6/2008 | Chuang | ................ | H03K 3/0375 |
| | | | | 326/46 |
| 8,305,112 B2 * | 11/2012 | Lau | .................... | H03K 19/0016 |
| | | | | 326/31 |
| 2007/0126486 A1 * | 6/2007 | Lee | ........................ | H03K 3/012 |
| | | | | 327/218 |
| 2008/0315931 A1 * | 12/2008 | Maeda | ............... | H03K 19/0016 |
| | | | | 327/198 |
| 2009/0066386 A1 * | 3/2009 | Lee | ........................ | H03K 3/012 |
| | | | | 327/202 |
| 2020/0341537 A1 * | 10/2020 | Samson | .................... | G06F 1/28 |

* cited by examiner

*Primary Examiner* — Sung Il Cho

(74) *Attorney, Agent, or Firm* — JCIPRNET

(57) ABSTRACT

A memory cell is configured to store data and operate in an operational state or a sleep state. A first set of transistors is configured to transfer data from the data sensing node of the memory cell to a data latch node, in response to the memory cell being in the operational state. A second set of transistors is configured to latch the data at the data latch node, in response to the memory cell being in the operational state. A third set of transistors is configured to latch the data at the data latch node, in response to the memory cell being in the sleep state. The first set of transistors is further configured to transfer the data from the data latch node to the data sensing node of the memory cell, in response to the memory cell being transitioned from the sleep state to the operational state.

20 Claims, 8 Drawing Sheets

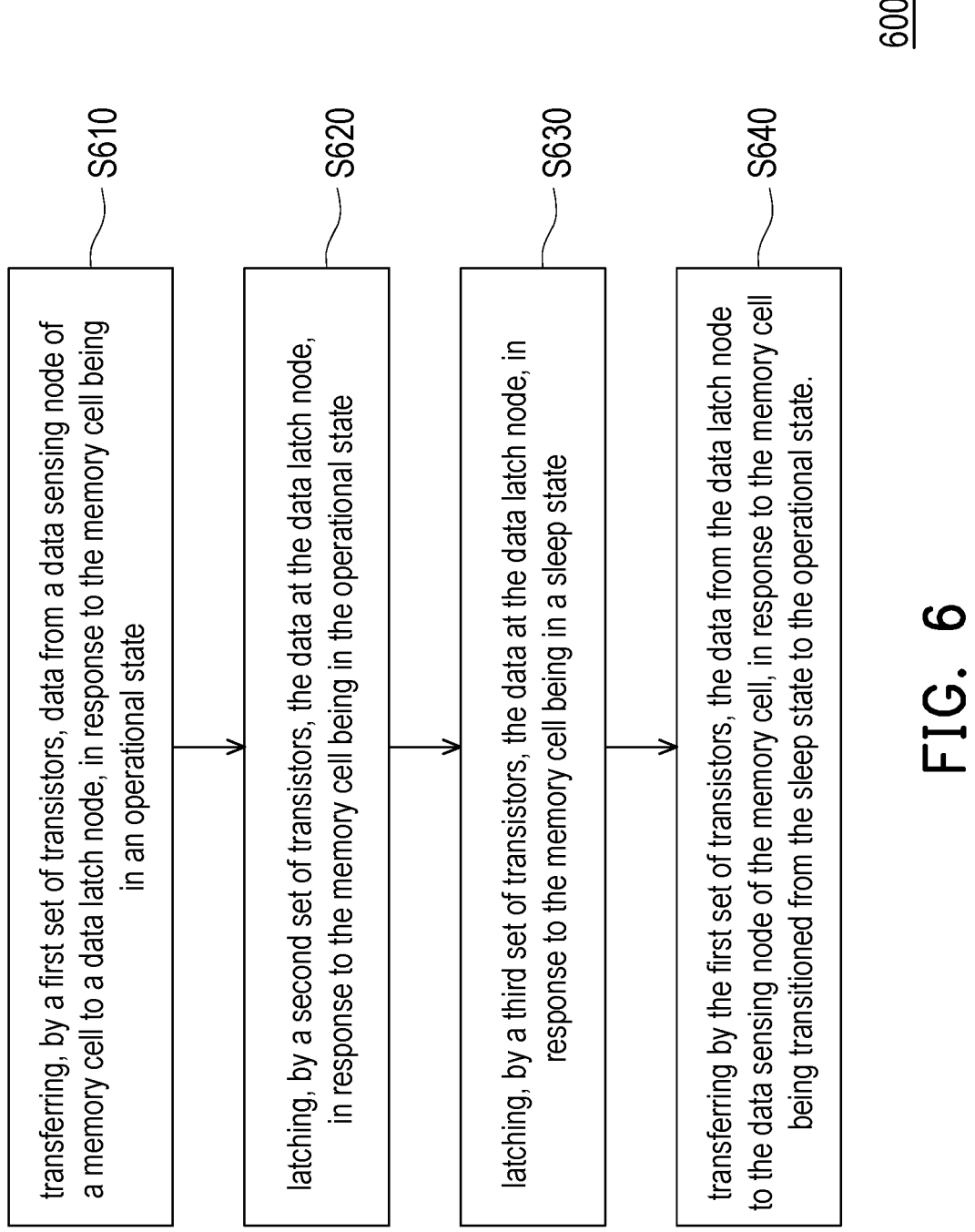

600

S610 transferring, by a first set of transistors, data from a data sensing node of a memory cell to a data latch node, in response to the memory cell being in an operational state

S620 latching, by a second set of transistors, the data at the data latch node, in response to the memory cell being in the operational state

S630 latching, by a third set of transistors, the data at the data latch node, in response to the memory cell being in a sleep state

S640 transferring by the first set of transistors, the data from the data latch node to the data sensing node of the memory cell, in response to the memory cell being transitioned from the sleep state to the operational state.

FIG. 6

MEMORY DEVICE AND DATA LATCHING METHOD

BACKGROUND

Technical Field

The disclosure relates to a memory device; particularly, the disclosure relates to a memory and a data latching method.

Description of Related Art

When a static random access memory (SRAM) goes in a shutdown or a deep sleep mode, all data output node (e.g. Q) may be clamped at logic 0. After the power is wakeup, the data output node may go to either logic 1 or stay at logic 0. That is, the last read data is not stored inside SRAM in the shutdown mode or the deep sleep mode.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 6 is a schematic flowchart of a data latching method according to an embodiment of the disclosure.

DESCRIPTION OF THE EMBODIMENTS

Figure 1:
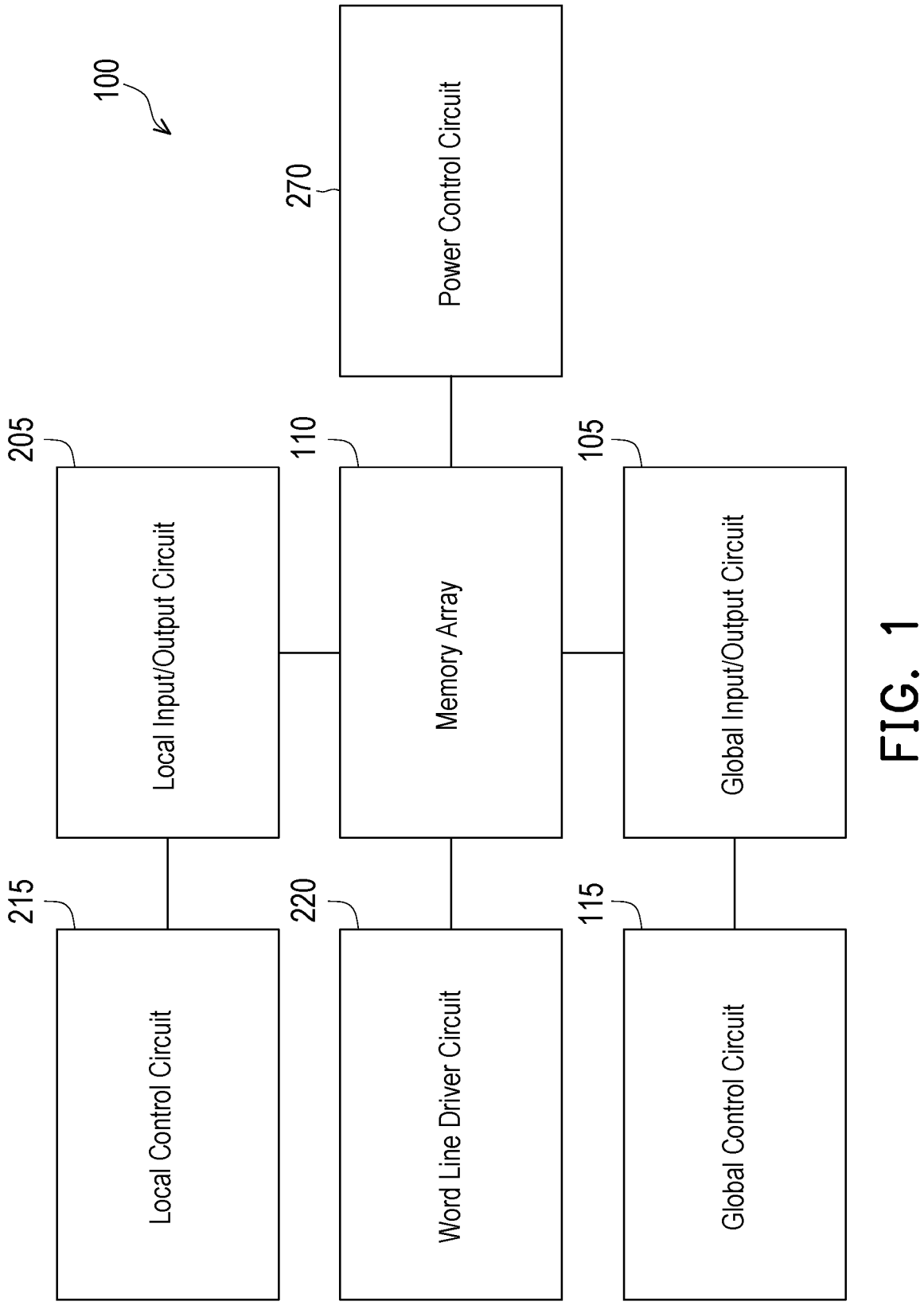
FIG. 1 is a schematic block diagram of a memory device according to an embodiment of the disclosure.

Reference will now be made in detail to the exemplary embodiments of the disclosure, examples of which are illustrated in the accompanying drawings. Whenever possible, the same reference numbers are used in the drawings and the description to refer to the same or like components.

Certain terms are used throughout the specification and appended claims of the disclosure to refer to specific components. Those skilled in the art should understand that electronic device manufacturers may refer to the same components by different names. This article does not intend to distinguish those components with the same function but different names. In the following description and rights request, the words such as "comprise" and "include" are open-ended terms, and should be explained as "including but not limited to . . . ".

The term "coupling (or connection)" used throughout the whole specification of the present application (including the appended claims) may refer to any direct or indirect connection means. For example, if the text describes that a first device is coupled (or connected) to a second device, it should be interpreted that the first device may be directly connected to the second device, or the first device may be indirectly connected through other devices or certain connection means to be connected to the second device. The terms "first", "second", and similar terms mentioned throughout the whole specification of the present application (including the appended claims) are merely used to name discrete elements or to differentiate among different embodiments or ranges. Therefore, the terms should not be regarded as limiting an upper limit or a lower limit of the quantity of the elements and should not be used to limit the arrangement sequence of elements. In addition, wherever possible, elements/components/steps using the same reference numerals in the drawings and the embodiments represent the same or similar parts. Reference may be mutually made to related descriptions of elements/components/steps using the same reference numerals or using the same terms in different embodiments.

It should be noted that in the following embodiments, the technical features of several different embodiments may be replaced, recombined, and mixed without departing from the spirit of the disclosure to complete other embodiments. As long as the features of each embodiment do not violate the spirit of the disclosure or conflict with each other, they may be mixed and used together arbitrarily.

When a static random access memory (SRAM) goes in a shutdown or a deep sleep mode, all data output node (e.g. Q) may be clamped at logic 0. After the power is wakeup, the data output node may go to either logic 1 or stay at logic 0. That is, the last read data is not stored inside SRAM in the shutdown mode or the deep sleep mode.

For some applications at system level, there is a need to retain the last read data (last state of the memory cell) before the memory cell goes in the shutdown mode or the deep sleep mode. Currently, the last read data may be written in a non-volatile memory (NVM) before the mode or the deep sleep mode. Then, after the power wakeup, the last read data may be read from the NVM and may be written into SRAM. However, this process may consume lots of power in performing two write operations (one in NVM and one in SRAM) and one read operation from SRAM. Therefore, how to develop a memory device to retain the last read data with a lower cost of energy is becoming an issue to work on.

FIG. 1 is a schematic block diagram of a memory device according to an embodiment of the disclosure. In one embodiment, a memory device 100 may be a random access memory, such as a static random access memory (SRAM) device or another type of memory device such as a dynamic random access memory (DRAM) device. However, this disclosure is not limited thereto. As shown in FIG. 1, the memory device 100 may include at least one memory array 110, as well as a plurality of peripheral circuits such as a word line (WL) driver circuit 220, a local input/output (IO) circuit 205, a local control circuit 215, a global IO circuit 105, a global control circuit 115, and a power control circuit 270. The memory device 100 may include other components not shown in FIG. 1. In example embodiments, the memory device 100 may be part of an integrated circuit (IC) chip.

In one embodiment, the memory array 110 may include a number of memory cells (also referred to as bit cells) that are configured to store information in the form of '0' or '1'. The process of storing information to the memory array 110 is known as "writing." The process of reading information stored on the memory array 110 is known as "reading." Reading and writing are example functions of the memory device 100. In order to perform these functions, some electrical components that make up the memory device 100 require power and need to be turned on. However, not all electrical components require power during these functions and may be turned off temporarily (e.g., placed into a sleep mode). The process of turning on or off certain electrical components within the memory device is known as power management. Power management of the memory device 100 occurs using a series of power management signals sent to the electrical components to tell them whether to turn on or off. Certain electrical components take some time to turn on or wake up when power has been turned off or minimized. In order for the functions such as reading and writing to run smoothly, power should be maintained to the components performing particular operations with minimal to no impact, while simultaneously turning on or off other electrical components.

In some embodiments, the memory array 110 may include NAND flash memory cores. In other embodiments, the memory array 110 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array 110.

The memory array 110 may include bit cells arranged in a matrix of rows and columns. Each of the memory cells of the memory array 110 may be operative to store one bit of information. For example, in some implementations, each memory cell may use six transistors (6T) connected between an upper reference potential and a lower reference potential (typically ground) such that one of two storage nodes may be occupied by the information to be stored, with the complementary information stored at the other storage node.

The memory array 110 includes a plurality of word lines and a plurality of bit line pairs. Each memory cell of the memory array 110 is connected to a word line and a bit line pair. A word line may be operative to activate access to the memory cells of a row connected to the word line. The bit line pair is used to access information stored or to be stored in the memory cells activated by the word line. Although the memory device 100 is shown to include only one memory array 110 for ease of discussion, the memory device 100 could include multiple memory arrays 110.

The peripheral devices include circuits that provide various functions of the memory device 100 associated with the memory array 110. For instance, the word line driver circuit 220 of the memory device 100 may be operative to select a word line of the memory array 110 and charge the selected word line to a logic high. The logic high is approximately equal to a first predefined potential. In example embodiments, the word line driver circuit 220 is a decoder circuit that includes a plurality of logic operators to decode potentials on address lines to identify a word line to activate. The address lines are charged to logic high (that is, approximately equal to the first potential) or logic low (that is, approximately equal to a second potential). In example embodiments, the second predetermined potential is approximately equal to the ground potential or zero volts. The logic high is represented by bit 1 and the logic low is represented by bit 0.

The local IO circuit 205 of the memory device 100 may be operative to read data from and write data into the memory array 110. For example, the local IO circuit 205 may be operative to sense potentials at the plurality of bit line pairs and compare the potentials for each pair. In example embodiments, when the potential of a first bit line is more than the potential of a second bit line of a bit line pair, local IO circuit 205 reads the output to be logic 1. In addition, when the potential of a first bit line is less than the potential of the second bit line of the bit line pair, local IO circuit 205 reads the output to be logic 0.

The local control circuit 215 of the memory device 100 may be operative to control the local IO circuit 205. For example, the local control circuit 215 may be operative to configure the local IO circuit 205 in a read mode to read information from the memory array 110 or in a write mode to write information into the memory array 110. In addition, the local control circuit 215 may be operative to enable the local IO circuit 205 in a hold mode where no data is read from or written into memory array 110.

The global IO circuit 105 of the memory device 100 may be operative to combine input/output from the local IO circuits 205. For example, the memory device 100 may include multiple memory arrays 110 each having a respective local IO circuit 205. The global IO circuit 105 may be operative to combine the information from multiple local IO circuits 205 into a global IO of the memory device 100. For example, local IO circuits 205 are operable to store output from the memory arrays 110 in a shift register, the global IO circuit 105 is operable to read the data from the shift register, and provide the data as the output of memory device 100.

The global control circuit 115 of the memory device 100 may be operative to control the global IO circuit 105. For example, the global control circuit 115 may be operative to configure the global IO circuit 105 to select one or more local IO circuits 205 to read data from or write data into. In another example, the global control circuit 115 may be operative to configure a reading sequence for the global IO circuit 105 to read data from, or a writing sequence to write data into one or more local IO circuits 205.

The power control circuit 270 may be operative to control and manage power for one or more components of the memory device 100. For example, the power control circuit 270 may be operative to selectively connect one or more components of the memory device 100 to a voltage terminal in some embodiments. The power control circuit 270 includes a plurality of logic gates or power gates. Each of the plurality of power gates may be operative to power up or power down an associated component of the memory device 100. The power gates are enabled by a signal. For example, a first signal enables a power gate to power up a component and a second signal enables the power gate to power down the component.

Figure 2:
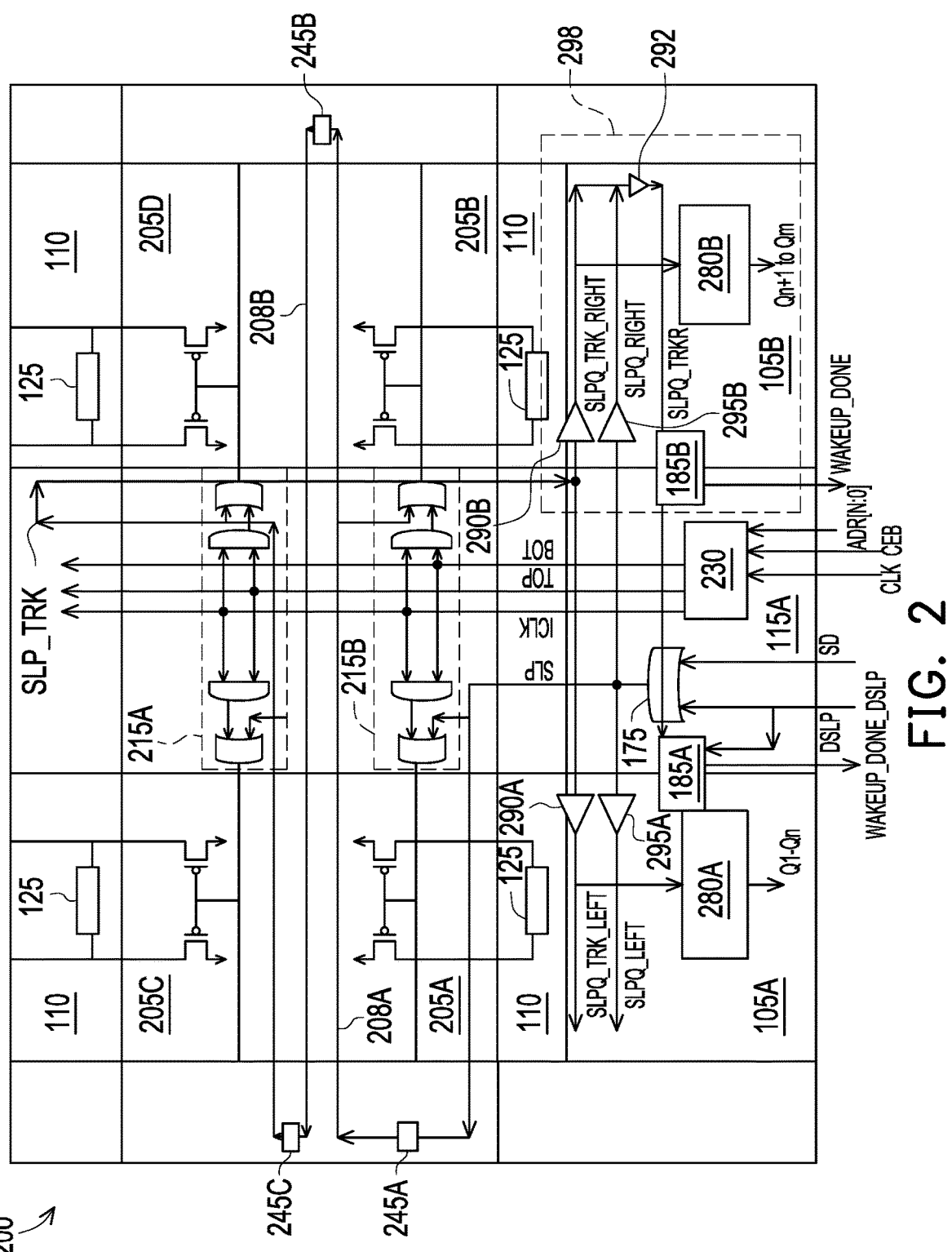
FIG. 2 is a schematic diagram of a memory device according to an embodiment of the disclosure.

FIG. 2 is a schematic diagram of a memory device according to an embodiment of the disclosure. Referring to FIG. 1 and FIG. 2, a memory device 200 may be an exemplary embodiment of the memory device 100, but this disclosure is not limited thereto. In some embodiments, the memory device 200 may include a memory controller coupled to the memory array 110. The memory device 200 may be divided into regions, and each region may be configured separately or independently. In one example, the memory device 200 may be divided into a top region and a bottom region. The memory device 200 may include an interface circuit 215A that receives a top control signal TOP and an internal clock signal ICLK from the memory controller and operates memory cells 125 in the top region of the memory array 110 of the memory device 200 according to the top control signal TOP and the internal clock signal ICLK. The memory device 200 may include an interface circuit 215B that receives a bottom control signal BOT and the internal clock signal ICLK from the memory controller and operates the memory cells 125 in the bottom region of the memory array 110 of the memory device 200 according to the bottom control signal BOT and the internal clock signal ICLK.

In one embodiment, the interface circuits 215A, 215B may be part of the local control circuit 215, but this disclosure is not limited thereto. The interface circuits 215A, 215B may receive a sleep control signal SLP or a delayed signal of the sleep control signal SLP from the memory controller and cause the memory cells 125 to change the state according to the sleep control signal SLP. The sleep control signal may be a signal causing the memory cells 125 to enter a sleep state or an operational state. For example, the memory device 200 may include buffer circuits 245A, 245B, 245C (also known as buffer circuits 245) that propagate the sleep control signal SLP. The buffer circuits 245A, 245B, 245C may be connected in cascade to propagate the sleep control signal SLP. Each of the buffer circuits 245A, 245B, 245C may delay a sleep control signal SLP or a delayed sleep control signal, such that a corresponding region of memory cells 125 may be individually or separately controlled. Rather than simultaneously configuring a state of a large set of memory cells 125, configuring a state of subsets or regions of memory cells according to delayed control signals may help prevent a large amount of current through the set of memory cells 125 in a short time period to protect the memory cells 125.

In one configuration, the interface circuit 215B receives the sleep control signal SLP and causes memory cells 125 in a left portion 205A of the bottom region to enter the sleep state or the operational state according to the sleep control signal SLP. The buffer circuit 245A may delay the sleep control signal SLP to obtain a first delayed signal 208A. The interface circuit 215B may receive the first delayed signal 208A, and cause memory cells 125 in a right portion 205B of the bottom region to enter the sleep state or the operational state according to the first delayed signal 208A. The buffer circuit 245B may delay the first delayed signal 208A to obtain a second delayed signal 208B. The interface circuit 215A may receive the second delayed signal 208B, and cause memory cells 125 in a left portion 205C of the top region to enter the sleep state or the operational state according to the second delayed signal 208B. The buffer circuit 245C may delay the second delayed signal 208B to obtain a sleep tracking signal SLP_TRK. The interface circuit 215A may receive the sleep tracking signal SLP_TRK, and cause memory cells 125 in a right portion 205D of the top region to enter the sleep state or the operational state according to the sleep tracking signal SLP_TRK. In one aspect, the sleep tracking signal SLP_TRK is a last delayed signal of the sleep control signal SLP propagated through the buffer circuits 245A, 245B, 245C. Although three buffer circuits 245A, 245B, 245C are shown in FIG. 2, the memory device 200 may include a different number of the buffer circuits 245.

In one embodiment, the left portion 205A of the bottom region, the right portion 205B of the bottom region, the left portion 205C of the top region, and the right portion 205D of the top region may be part of the local IO circuit 205, but this disclosure is not limited thereto. Each of the bottom region, the right portion 205B of the bottom region, the left portion 205C of the top region, and the right portion 205D of the top region may include IO transistors for read data from and write data into the memory cells 125. The IO transistors may include a sense amplifier (SA), but this disclosure is not limited thereto.

In some embodiments, the memory controller may include a sleep control circuit 175, wake-up detection circuits 185A, 185B, a decoder 230, output drivers 280A, 280B, and delay circuits 290A, 290B, 295A, 295B, 292. These components may operate together to configure the status of the memory device 200, and generate a signal reporting the status of the memory device 200. In some embodiments, the memory controller may include more, fewer, or different components than shown in FIG. 2. For example, the memory controller may include the global control circuit 115 and the global IO circuit 105. In one embodiment, the sleep control circuit 175, the wake-up detection circuits 185A, 185B, and the decoder 230 may be part of the global control circuit 115, but this disclosure is not limited thereto. For example, the sleep control circuit 175, the wake-up detection circuits 185A, 185B, and the decoder 230 may be an interface circuit 115A of the global control circuit 115. In one embodiment, the output drivers 280A, 280B, and the delay circuits 290A, 290B, 295A, 295B, 292 may be part of the global IO circuit 105, but this disclosure is not limited thereto. For example, the output drivers 280A and the delay circuits 290A, 295A may form a left portion 105A of the global IO circuit 105 and the output drivers 280B and the delay circuits 290B, 295B, 292 may form a right portion 105B of the global IO circuit 105

In some embodiments, the decoder 230 may be a component that receives a clock signal CLK, an enable signal CEB, and an address signal ADR[N:0], for example, from a host device or a processing device, and generates the internal clock signal ICLK, the top control signal TOP, and the bottom control signal BOT, accordingly. In some embodiments, the decoder 230 may be replaced by a different component that may perform the functionalities of the decoder 230 disclosed herein. For example, the decoder 230 may generate the internal clock signal ICLK having pulses of the clock signal CLK, in response to the enable signal CEB enabling the internal clock signal ICLK to be provided to the top region or the bottom region. The decoder 230 may select the top region or the bottom region, according to the address signal ADR[N:0] and generate the top control signal TOP or the bottom control signal BOT, accordingly. For example, in response to the address signal ADR[N:0] indicating the memory cells 125 of the top region, the decoder 230 may generate the top control signal TOP to enable providing the internal clock signal ICLK to the memory cell 125 of top region. For example, in response to the address signal ADR[N:0] indicating the memory cells of the bottom region, the decoder 230 may generate the bottom control signal BOT to enable providing the internal clock signal ICLK to the memory cells of the bottom region.

In some embodiments, the sleep control circuit 175 may be configured to receive a deep sleep signal DSLP and a shutdown signal SD, and to generate the sleep control signal SLP according to the deep sleep signal DSLP and the shutdown signal SD. The deep sleep signal DSLP and the shutdown signal SD may be signals to configure the memory device 200 in the sleep state or the operational state. The deep sleep signal DSLP may be provided from a first device (e.g., processor or external host device), where the shutdown signal SD may be provided from a second device (e.g., control device or internal device). The sleep control circuit 175 may be embodied as an OR gate. The sleep control circuit 175 may perform an OR operation on the deep sleep signal DSLP and the shutdown signal SD to generate the sleep control signal SLP. For example, the sleep control circuit 175 may generate the sleep control signal SLP having a high voltage (e.g., 1V), in response to either one of the deep sleep signal DSLP or the shutdown signal SD having a high voltage (e.g., 1V). For example, the sleep control circuit 175 may generate the sleep control signal SLP having a low voltage (e.g., 0V), in response to both the deep sleep signal DSLP and the shutdown signal SD having a low voltage (e.g., 0V). In some embodiments, the sleep control circuit 175 may be replaced by a different component that may perform the functionalities of the sleep control circuit 175 disclosed herein.

In some embodiments, the delay circuits 290A, 290B, 292 are circuits to delay the sleep tracking signal SLP_TRK. Each of the delay circuits 290A, 290B, 292 may include an even number of inverter circuits, one or more amplifier circuits, one or more buffer circuits, one or more resistive delay circuits, adjustable delay circuits, or any delay circuits.

The delay circuit 290A may delay the sleep tracking signal SLP_TRK to obtain a delayed sleep tracking signal SLPQ_TRK_LEFT and provide the delayed sleep tracking signal SLPQ_TRK_LEFT to the output drivers 280A. The delay circuit 290A may operate as a buffer between the buffer circuit 245C and the output drivers 280A to reduce a capacitive load at the output of the buffer circuit 245C.

Similarly, the delay circuit 290B may be configured to delay the sleep tracking signal SLP_TRK to obtain a delayed sleep tracking signal SLPQ_TRK_RIGHT and to provide the delayed sleep tracking signal SLPQ_TRK_RIGHT to the output drivers 280B. The delay circuit 290B may operate as a buffer between the buffer circuit 245C and the output drivers 280B to reduce a capacitive load at the output of the buffer circuit 245C.

In some embodiments, the delay circuit 292 may be configured to receive the delayed sleep tracking signal SLPQ_TRK_RIGHT and to delay the delayed sleep tracking signal SLPQ_TRK_RIGHT to obtain another delayed sleep tracking signal SLPQ_TRKR. The delay circuit 292 may provide the delayed sleep tracking signal SLPQ_TRKR to the wake-up detection circuits 185A, 185B (also referred to as 185). In some embodiments, the delay circuit 292 may receive the delayed sleep tracking signal SLPQ_TRK_LEFT instead of the delayed sleep tracking signal SLPQ_TRK_RIGHT and delay the delayed sleep tracking signal SLPQ_TRK_LEFT to obtain the delayed sleep tracking signal SLPQ_TRKR.

In some embodiments, the delay circuits 295A, 295B are circuits to delay the sleep control signal SLP. The delay circuit 295A may delay the sleep control signal SLP to obtain a delayed sleep control signal SLPQ_LEFT and provide the delayed sleep control signal SLPQ_LEFT to the output drivers 280A. The delay circuit 295A may operate as a buffer between the sleep control circuit 175 and the output drivers 280A to reduce a capacitive load at the output of the sleep control circuit 175. Similarly, the delay circuit 295B may delay the sleep control signal SLP to obtain a delayed sleep control signal SLPQ_RIGHT and provide the delayed sleep control signal SLPQ_RIGHT to the output drivers 280B. The delay circuit 295B may operate as a buffer between the sleep control circuit 175 and the output drivers 280B to reduce a capacitive load at the output of the sleep control circuit 175.

In some embodiments, the output drivers 280A, 280B (also referred to as 280) are circuits to provide data stored by a set of memory cells 125. In one aspect, the output drivers 280A in the left region 105A are coupled to one or more sense amplifiers that amplify signals corresponding to data stored by memory cells 125 in the left regions 205A, 205C. In one aspect, the output drivers 280B in the right region 105B are coupled to one or more sense amplifiers that amplify signals corresponding to data stored by memory cells 125 in the right regions 205B, 205D.

The output drivers 280A may receive the delayed sleep tracking signal SLPQ_TRK_LEFT, the delayed sleep control signal SLPQ_LEFT, and amplified signals from sense amplifiers corresponding to memory cells 125 in the left region and generate output data signals Q1 . . . . Qn corresponding to data stored by the memory cells 125 in the left region, accordingly. For example, in response to the delayed sleep tracking signal SLPQ_TRK_LEFT indicating that the memory cells 125 are in the sleep state or the delayed sleep control signal SLPQ_LEFT causing the output drivers 280A to be configured in the sleep state, the output drivers 280A may generate the output data signals Q1 . . . . Qn having a predetermined voltage (e.g., 0V corresponding to a bit '0'). For example, in response to the delayed sleep tracking signal SLPQ_TRK_LEFT indicating that the memory cells 125 are in the operational state and the delayed sleep control signal SLPQ_LEFT causing the output drivers 280A to be configured in the operational state, the output drivers 280A may generate the output data signals Q1 . . . . Qn indicating the stored data, according to the amplified signals from the sense amplifiers.

The output drivers 280B may operate in a similar manner as the output drivers 280A with respect to the delayed sleep tracking signal SLPQ_TRK_RIGHT, the delayed sleep control signal SLPQ_RIGHT, and amplified signals from sense amplifiers corresponding to memory cells 125 in the right region and generate output data signals Qn+1 . . . . Qm corresponding to data stored by the memory cells 125 in the right region, accordingly. Detailed description on configuration and operation of the output drivers 280A, 280B is provided below with respect to FIG. 3.

In some embodiments, the wake-up detection circuits 185A, 185B are circuits that generate wake up complete signals WAKEUP_DONE_SD, WAKEUP_DONE_DSLP (also referred to as "WAKEUP_DONE"). A wake-up complete signal WAKEUP_DONE may indicate whether the wake up sequence is completed or not. In one aspect, the wake-up detection circuits 185A, 185B receive the delayed sleep tracking signal SLPQ_TRK_RIGHT or the delayed sleep tracking signal SLPQ_TRK_LEFT, and generate the wake up complete signals WAKEUP_DONE, accordingly. For example, in response to the delayed sleep tracking signal SLPQ_TRK_RIGHT or the delayed sleep tracking signal SLPQ_TRK_LEFT indicating that the memory cells 125 are operating in the sleep state, the wake-up detection circuits 185A, 185B may generate the wake-up complete signals WAKEUP_DONE having a first voltage (e.g., 1V) to indicate that the wake up sequence is incompleted. For example, in response to the delayed sleep tracking signal SLPQ_TRK_RIGHT or the delayed sleep tracking signal SLPQ_TRK_LEFT indicating that the memory cells 125 are operating in the operational state, the wake-up detection circuits 185A, 185B may generate the wake up complete signals WAKEUP_DONE having a second voltage (e.g., 0V) to indicate that the wake up sequence is completed.

Detailed description on configuration and operation of wake-up detection circuits 185A, 185B is provided below with respect to FIG. 3.

Figure 3:
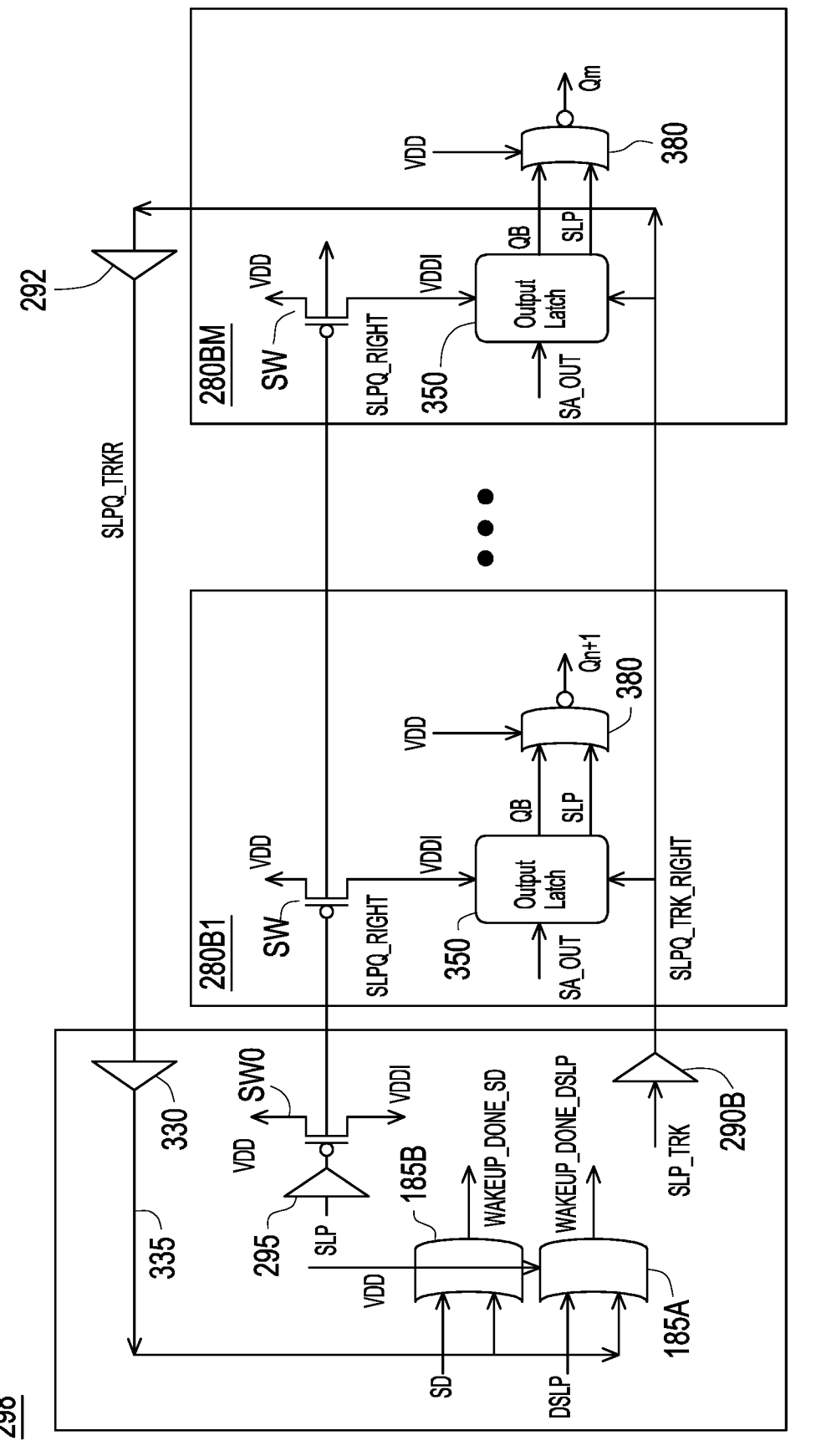
FIG. 3 is a schematic diagram of an output control portion of a memory device according to an embodiment of the disclosure.

FIG. 3 is a schematic diagram of an output control portion of a memory device according to an embodiment of the disclosure. Referring to FIG. 1 to FIG. 3, FIG. 3 depicts an output control portion 298 of the memory device 200 in FIG. 2, but this disclosure is not limited thereto. In one aspect, the output control portion 298 of the memory device 200 includes output drivers 280B1 . . . 280BM (also referred to as 280), the delay circuits 290B, 292, 295 (e.g., 295B), and the wake-up detection circuit 185A, 185B.

In some embodiments, the delay circuit 290B receives the sleep tracking signal SLP_TRK and generates a delayed sleep tracking signal SLPQ_TRK_RIGHT. The output drivers 280B1 . . . 280BM may receive the delayed sleep tracking signal SLPQ_TRK_RIGHT and generate output data signals Qn+1 . . . . Qm, according to the delayed sleep tracking signal SLPQ_TRK_RIGHT. The delay circuit 292 may receive the delayed sleep tracking signal SLPQ_TRK_RIGHT after the delayed sleep tracking signal SLPQ_TRK_RIGHT is provided to the output driver 280BM and delay the delayed sleep tracking signal SLPQ_TRK_RIGHT to obtain another delayed sleep tracking signal SLPQ_TRKR. The delay circuit 292 may provide the delayed sleep tracking signal SLPQ_TRKR to a delay circuit 330. The delay circuit 292 may operate as a buffer or an amplifier to amplify the delayed signal SLPQ_TRK_RIGHT provided to the output drivers 280B1 . . . 280BM. The delay circuit 330 may receive the delayed sleep tracking signal SLPQ_TRKR and delay the delayed sleep tracking signal SLPQ_TRKR to obtain a delayed signal 335. The delay circuit 330 may operate as a buffer or an amplifier to amplify the delayed sleep tracking signal SLPQ_TRKR provided from the delay circuit 292 through a long metal rail extending along the output drivers 280B1 . . . 280BM. The delay circuit 330 may include an even number of inverter circuits, one or more amplifier circuits, one or more buffer circuits, one or more resistive delay circuits, an adjustable delay circuits, or any delay circuits. The delay circuit 330 may provide the delayed signal 335 to the wake-up detection circuits 185A, 185B.

In some embodiments, the wake-up detection circuit 185A may include or may be implemented as an OR gate. The wake-up detection circuit 185A may receive the delayed signal 335 and a deep sleep signal DSLP, and perform an OR operation on the delayed signal 335 and the deep sleep signal DSLP to generate the wake up complete signal WAKE-UP_DONE_DSLP according to the OR operation.

In some embodiments, the wake-up detection circuit 185B may include or may be implemented as an OR gate. The wake-up detection circuit 185B may receive the delayed signal 335 and a shutdown signal SD and perform OR operation on the delayed signal 335 and the shutdown signal SD to generate the wake up complete signal WAKE-UP_DONE_SD according to the OR operation.

In one aspect, each of the output drivers 208B1 . . . 280BM may include an output latch 350, a power switch SW, and an output circuit 380. These components may operate together to selectively provide an output data signal Q (e.g., the output data signals Qn+1 . . . . Qm), according to the delayed sleep control signal SLPQ_RIGHT, the delayed sleep tracking signal SLPQ_TRK_RIGHT, or both. For example, in response to the delayed sleep tracking signal SLPQ_TRK_RIGHT indicating that the memory cell 125 is in the sleep state or the delayed sleep control signal SLPQ_RIGHT causing the output latch 350 to be configured in the sleep state, the output drivers 280 may generate the output data signal Q having a predetermined voltage (e.g., 0V corresponding to a bit '0'). For example, in response to the delayed sleep tracking signal SLPQ_TRK_RIGHT indicating that the memory cell 125 is in the operational state and the delayed sleep control signal SLPQ_RIGHT causing the output latch 350 to be configured in the operational state, the output drivers 280 may generate the output data signal Q indicating the stored data, according to an amplified signal SA_OUT from a sense amplifier coupled to the memory cell 125.

In one configuration, the power switch SW may be embodied as a P-type transistor. In some embodiments, the power switch SW may be replaced by a different component that may perform the functionalities of the power switch SW disclosed herein. The power switch SW may include a source electrode coupled to a power rail to receive a supply voltage VDD, a gate electrode coupled to an output of a delay circuit 295, and a drain electrode coupled to an output latch 350. In this configuration, the power switch SW may receive the delayed sleep control signal SLPQ_RIGHT and selectively provide an internal supply voltage VDDI corresponding to the supply voltage VDD to the output latch 350, according to the delayed sleep control signal SLPQ_RIGHT. For example, the power switch SW may be enabled, in response to the delayed sleep control signal SLPQ_RIGHT having a low voltage (e.g., 0V) to provide the supply voltage VDD to the internal supply voltage VDDI of the output latch 350. For example, the power switch SW may be disabled, in response to the delayed sleep control signal SLPQ_RIGHT having a high voltage (e.g., 1V) to not provide the supply voltage VDD to the internal supply voltage VDDI of the output latch 350.

The output latch 350 may be configured to receive the amplified signal SA_OUT corresponding to the stored data of a memory cell 125 from a sense amplifier and to store the amplified signal SA_OUT as an output data signal QB. Further, the output latch 350 may be configured to receive the delayed sleep tracking signal SLPQ_TRK_RIGHT from the delay circuit 290B and to provide the sleep control signal SLP to the output circuit 380. In some embodiments, the output latch 350 may be replaced by a different component that may perform the functionalities of the output latch 350 disclosed herein. In one configuration, the output latch 350 includes an input coupled to an output of a sense amplifier and an output coupled to a first input terminal of the output circuit 380. In this configuration, when the internal supply voltage VDDI has a sufficient voltage (e.g., larger than 0.7~0.9V), the output latch 350 may be enabled, and receive and store the amplified signal SA_OUT from the sense amplifier. When the internal supply voltage VDDI does not have the sufficient voltage, the output latch 350 may be disabled or may not be operational, and may not store the amplified signal SA_OUT from the sense amplifier.

The output circuit 380 is a component that generates the output data signal Q, according to the stored output data signal QB from the sense amplifier and the sleep control signal SLP from the output latch. In some embodiments, the output circuit 380 is embodied as a NOR circuit. In some embodiments, the output circuit 380 may be replaced by a different component that may perform the functionalities of the output circuit 380 disclosed herein. In one configuration, the output circuit 380 includes a first input terminal coupled to a first output terminal of the output latch 350, and a second input terminal coupled to a second output terminal of the output latch 350. In this configuration, the output circuit 380 may receive the stored output data signal QB at the first input terminal and the sleep control signal SLP at the second input terminal, and perform an OR operation on the stored output data signal QB and the sleep control signal SLP to generate the output data signal Q.

In some embodiments, the delay circuit 295 receives the sleep control signal SLP and generates the delayed sleep control signal SLPQ_RIGHT according to the sleep control signal SLP. According to the delayed sleep control signal SLPQ_RIGHT, the output drivers 280B1 . . . 280BM may be enabled or disabled. In one configuration, the output control portion 2985 includes a power switch SW0 coupled to an output of the delay circuit 295. In one configuration, the power switch SW0 is embodied as a P-type transistor. The power switch SW0 may be the same type of transistor as the power switches SWs in the output drivers 280. In some embodiments, the power switch SW0 may be replaced by a different component that may perform the functionalities of the power switch SW0 disclosed herein. The power switch SW0 may include a source electrode coupled to a power rail to receive a supply voltage VDD, a gate electrode coupled to the output of a delay circuit 295, and a drain electrode coupled to a power detection circuit (not shown). In this configuration, the drain electrode of the power switch SW0 may have the internal supply voltage VDDI, which may be provided to the power detection circuit to determine the internal supply voltage VDDI provided to the output drivers 280.

Advantageously, the memory device 200 may reduce power consumption when transitioning from the sleep state to the operational state. In one aspect, causing the output circuit 380 to generate the output signal Q having the predetermined voltage (e.g., 0V) in response to the sleep control signal SLP or the delayed sleep control signal SLPQ_RIGHT may cause the output driver 280 to consume power when the memory cell 125 has not sufficiently transitioned from the sleep state to the operational state. By causing the output circuit 380 to generate the output signal Q having the predetermined voltage in response to the sleep tracking signal SLP_TRK or the delayed sleep tracking signal SLPQ_TRK_RIGHT, power consumption of the output driver 280 when the memory cell 125 has not sufficiently transitioned from the sleep state to the operational state may be reduced or obviated.

Advantageously, the wake-up detection circuit 185 may generate the wake up complete signal WAKEUP_DONE (e.g., WAKEUP_DONE_SD or WAKEUP_DONE_DSLP) accurately, when the memory cell 125 and the output driver 280 have transitioned from the sleep state to the operational state. In one aspect, the internal supply voltage VDDI provided to the one or more circuits of the output driver 280 may change, in response to the sleep control signal SLP. For example, the internal supply voltage VDDI may be set to a first voltage (e.g., 0V) when the sleep control signal SLP having a second voltage (e.g., 1V) causes the output driver 280 to be in the sleep state. The internal supply voltage VDDI may be set to the second voltage (e.g., 1V) when the sleep control signal SLP having the first voltage (e.g., 0V) causes the output driver 280 to be in the operational state. Due to capacitive loading, the change in the internal supply voltage VDDI may be delayed with respect to the change in the sleep control signal SLP or the delayed sleep control signal SLPQ_RIGHT. By causing the wake-up detection circuit 185 to generate the wake-up complete signal WAKEUP_DONE based on the delayed signal 335, the wake up complete signal WAKEUP_DONE may be generated accurately when the internal supply voltage VDDI has reached a sufficient voltage for the output driver 280 to be operational.

Accordingly, prematurely causing other operations such as reading data stored by the memory cell 125 before the memory cell 125 and the output driver 280 have transitioned from the sleep state to the operational state may be obviated, such that the memory device 100 may operate in a reliable manner with reduced power consumption.

Figure 4B:
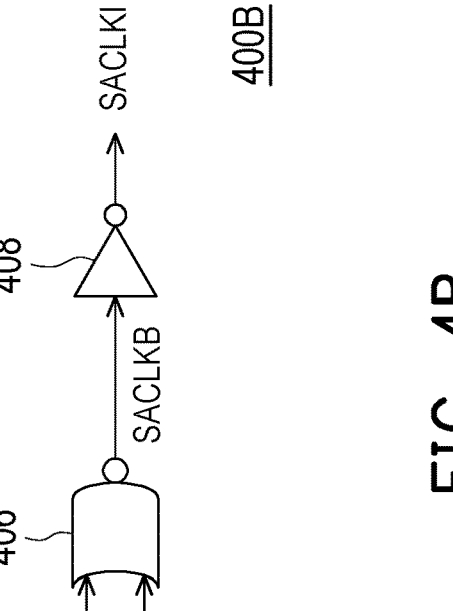
FIG. 4B is a schematic block diagram of an interface circuit of an output latch of memory device according to an embodiment of the disclosure.
Figure 4A:
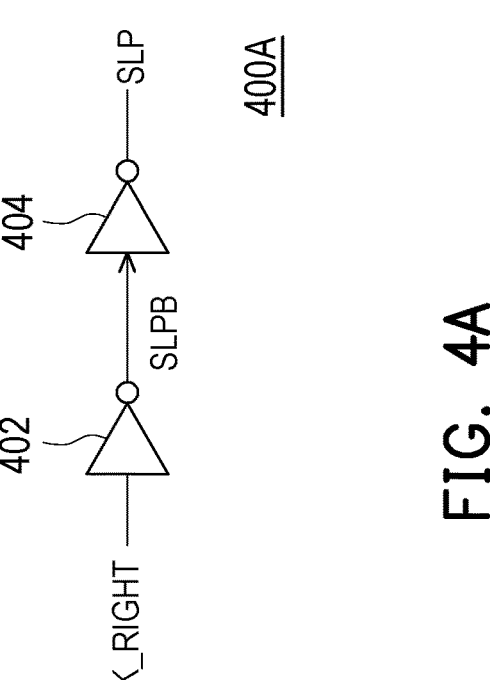
FIG. 4A is a schematic block diagram of an interface circuit of an output latch of memory device according to an embodiment of the disclosure.

FIG. 4A is a schematic block diagram of an interface circuit of an output latch of memory device according to an embodiment of the disclosure. FIG. 4B is a schematic block diagram of an interface circuit of an output latch of memory device according to an embodiment of the disclosure. Referring to FIG. 1 to FIG. 4B, the output latch 350 of FIG. 3 may include an interface circuit 400A and an interface circuit 400B. The interface circuits 400A, 400B may be operative to receive signals and provides signals to the electrical components in the output latch 350. The interface circuit 400A may operate as a buffer between the sense amplifier of the memory cell 125 and the electrical components of the output latch 350. The interface circuit 400B may operate as a state controller to control a state of the output latch 350.

Referring to FIG. 4A, the interface circuit 400A may include an inverter circuit 402 and an inverter circuit 404. In some embodiments, the inverter circuits 402, 404 may be respectively replaced by a different component that may perform the functionalities of the inverter circuits 402, 404 disclosed herein. The inverter circuit 402 may be configured to receive the delayed sleep tracking signal SLPQ_TRK_RIGHT and to provide an inverted sleep signal SLPB. The inverter circuit 402 may be configured to receive the inverted sleep signal SLPB and to provide the sleep control signal SLP. The inverted sleep signal SLPB and the sleep control signal may be configured to provide to the electrical components in the output latch 350.

Referring to FIG. 4B, the interface circuit 404 may include an input circuit 406 and an inverter circuit 408. In some embodiment, the input circuit 404 may be embodied as a NOR circuit. In some embodiments, the input circuit 406 and the inverter circuit 408 may be respectively replaced by a different component that may perform the functionalities of the input circuit 406 and the inverter circuit 408 disclosed herein.

In one embodiment, the input circuit 406 may be configured to receive a sense amplifier clock signal SACLK from the sense amplifier of the memory cell and the sleep control signal SLP from the interface circuit 400A. The sense amplifier clock signal may be an output signal of an OR operation of a sense amplifier enable signal and the internal clock signal ICLK. The input circuit 406 may perform an NOR operation on the sense amplifier clock signal SACLK and the sleep control signal SLP to generate a sense amplifier clock bar signal SACLKB. The sense amplifier clock bar signal SACLKB may be configured to provide to the electrical components in the output latch 350.

In one embodiment, the inverter circuit 408 may be configured to receive the sense amplifier clock bar signal SACLKB and to generate another sense amplifier clock signal SACLKI. The sense amplifier clock signal SACLKI may be configured to provide to the electrical components in the output latch 350.

Figure 4C:
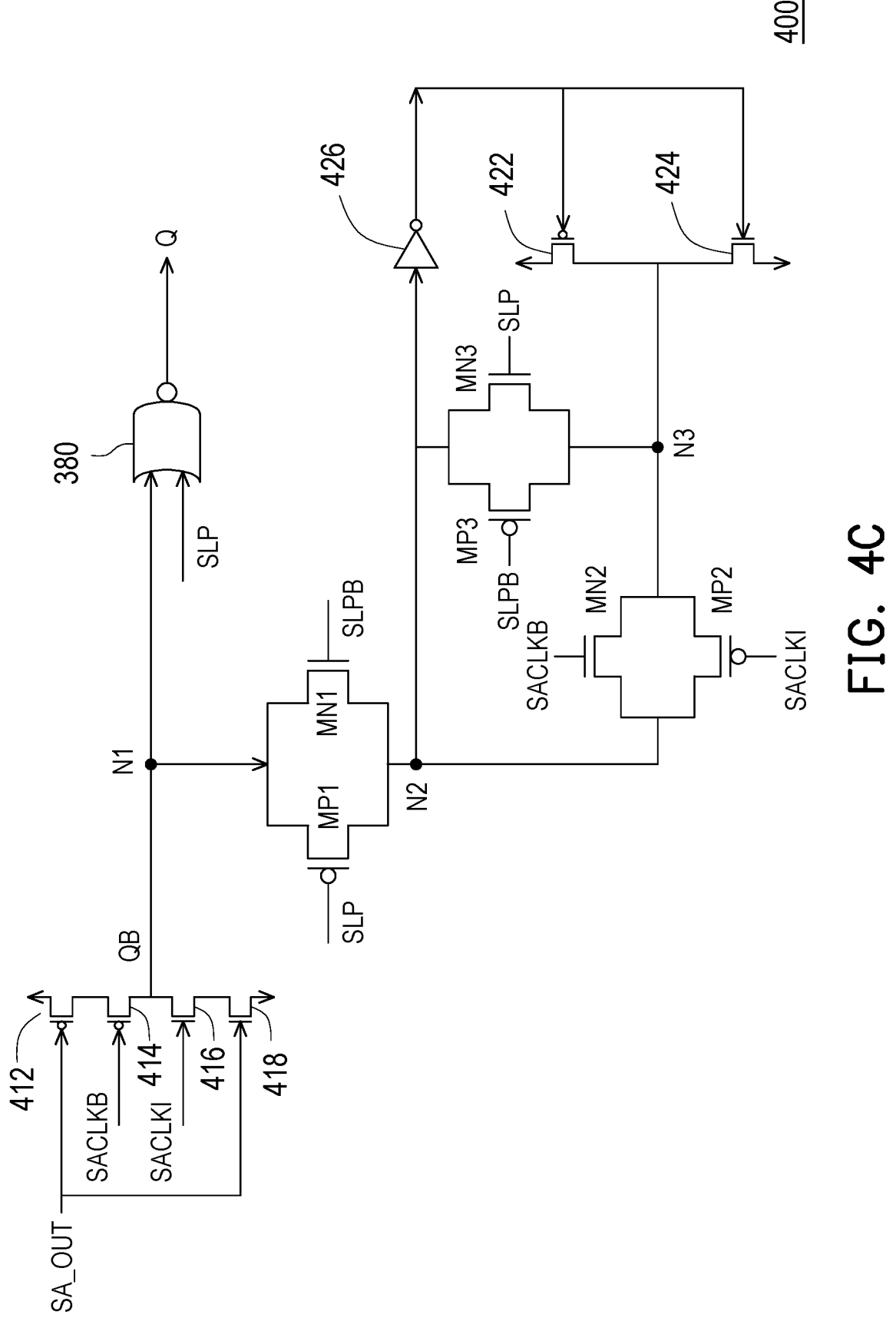
FIG. 4C is a schematic block diagram of an output latch and an output circuit of memory device according to an embodiment of the disclosure.

FIG. 4C is a schematic block diagram of an output latch and an output circuit of memory device according to an embodiment of the disclosure. As shown in FIG. 4C, the circuit 400 depicts an exemplary embodiment of the output latch 350 and the output circuit 380. The output circuit 380 of the circuit 400 may be same as the output circuit 380 and the rest of the circuit 400 may be an exemplary embodiment of the output latch 350. The details of the output circuit 380 of FIG. 4 may be referred to the descriptions of the output circuit 380 in FIG. 3, while the details are not redundantly described seriatim herein. The rest of the circuit 400 may include transferring transistors MP1, MN1 (also known as a first set of transistors), first latch transistors MP2, MN2 (also known as a second set of transistors), second latch transistors MN3, MP3 (also known as a third set of transistors), data sensing transistors 412, 414, 416, 418, transistors 422, 424 (also known as a fourth set of transistors), and an inverter circuit 426. A data sensing node N1 may be coupled between an output terminal of the data sensing transistors 412, 414, 416, 418 and the first set of transistors MP1, MN1. That is, the data sensing node N1 may be configured to receive (sense) the data of the memory cell 125 through the data sensing transistors 412, 414, 416, 418 and may be called the data sensing node N1 of the memory cell 125. A data latch node N2 may be coupled to the first set of transistors MP1, MN1. A data retaining node N3 may be coupled to an output terminal of the transistors 422, 424. However, this disclosure is not limited thereto. In another embodiment, the data sensing node N1 may be coupled to the sense amplifier coupled to the memory cell 125. That is, the data sensing node N1 may be configured to receive (sense) the amplified signal SA_OUT from the sense amplifier coupled to the memory cell 125.

In one embodiment, the data latch node N2 may be disposed between the transferring transistors MP1, MN1 and the first latch transistors MP2, MN2 and between the transferring transistors MP1, MN1 and the second latch transistors MP3, MN3. The data retaining node N3 may be disposed between the first latch transistors MP2, MN2 and the second latch transistors MP3, MN3. A gate electrode of the transferring transistor MP1 may be configured to receive the sleep control signal SLP and at least a gate electrode of the transferring transistors MN1 may be configured to receive the inverted sleep signal SLPB. Source electrodes of the transferring transistors MP1, MN1 may be coupled to the output terminal of the data sensing transistors 412, 414, 416, 418 to receive the output data signal QB from the memory cell as the data latched at the latch node N2. Drain electrodes of the transferring transistors MP1, MN1 may be coupled to source terminals of the first latch circuits MP2, MN2 and source terminals the second latch circuits MP3, MN3. Drain electrodes of the first latch circuits MP2, MN2 may be coupled to drain electrodes of the second latch circuits MP3, MN3.

In one embodiment, gate electrodes of the data sensing transistors 412, 418 may be configured to receive the amplified signal SA_OUT from the sense amplifier coupled to the memory cell 125. A gate electrode of the data sensing transistor 414 may be configured to receive the sense amplifier clock bar signal SACLKB and a gate electrode of the data sensing transistor 416 may be configured to receive the sense amplifier clock signal SACLKI. In response to the amplified signal SA_OUT, the sense amplifier clock bar signal SACLKB, and the sense amplifier clock signal SACLKI, the data sensing transistors 412, 414, 416, 418 are configured to output the output data signal QB at the output terminal of the data sensing transistors 412, 414, 416, 418. The data sensing transistors 412, 414 may be embodied as P-type transistors and the data sensing transistor 416, 418 may be embodied as N-type transistors. The output terminal maybe coupled between a drain terminal of the data sensing transistor 414 and a source terminal of the data sensing transistor 416.

The transferring transistors MP1, MN1 may be operative to transfer the data from the data sensing node N1 (the output terminal of the data sensing transistors 412, 414, 416, 418) to the data latch node N2 or to transfer the data from the data latch node N2 to the data sensing node N1. A gate electrode of the transferring transistor MP1 may be configured to receive the sleep control signal SLP from the interface circuit 400A. A gate electrode of the transferring transistor MN1 may be configured to receive the inverted sleep signal SLPB from the interface circuit 400A. While the memory cell 125 is in the operational state, in response to the sleep control signal SLP being a logic low and the inverted sleep signal SLPB being a logic high, the transferring transistors MP1, MN1 are turned on. Thus, the data sensing node N1 may be electrically coupled to the data latch node N2 through the transferring transistors MP1, MN1. While the memory cell 125 is in the sleep state, in response to the sleep control signal SLP being a logic high and the inverted sleep signal SLPB being a logic low, the transferring transistors MP1, MN1 are turned off. Thus, the data sensing node N1 may not be electrically coupled to the data latch node N2 through the transferring transistors MP1, MN1.

The first latch transistors MP2, MN2 may be operative to latch the data from the data sensing node N1 at the data latch node N2 while the memory cell 125 is in the operational state. A gate electrode of the first latch transistor MP2 may be configured to receive the sense amplifier clock signal SACLKI from the interface circuit 400B. A gate electrode of the first latch transistor MN2 may be configured to receive the sense amplifier clock bar signal SACLKB from the interface circuit 400B. While the memory cell 125 is in the operational state, in response to the sense amplifier clock signal SACLKI at logic low and the sense amplifier clock bar signal SACLKB being at logic high, the first latch transistors MP2, MN2 are turned on. Thus, the data latch node N2 may be electrically coupled to the data retaining node N3 through the first latch transistor MP2, MN2. Further, while the memory cell 125 is also in the operational state, in response to the sense amplifier clock signal SACLKI at logic high and the sense amplifier clock bar signal SACLKB being at logic low, the first latch transistors MP2, MN2 are turned off. Thus, the data latch node N2 may not be electrically coupled to the data retaining node N3 through the first latch transistors MP2, MN2. That is, while the memory cell 125 is in the operational state, the first latch transistors MP2, MN2 may be configured to turned on or off according to the sense amplifier clock signal SACLK. Furthermore, when the memory cell 125 is in the sleep state, in response to the sleep control signal SLP being a logic high, the first latch transistors MP2, MN2 may be turned off. Thus, the data latch node N2 may not be electrically coupled to the data retaining node N3 through the first latch transistors MP2, MN2. In this manner, while the memory cell 125 is in the operational state, the data from the memory cell 125 may be latched at the data latch node N2 by the first latch transistors MP2, MN2.

The second latch transistor MP3, MN3 may be operative to latch the data from the data sensing node N1 at the data latch node N2 while the memory cell 125 is in the sleep state. A gate electrode of the second latch transistor MP3 may be configured to receive the inverted sleep signal SLPB from the interface circuit 400A. A gate electrode of the second latch transistor MN3 may be configured to receive the sleep control signal SLP from the interface circuit 400A. While the memory cell 125 is in the operational state, in response to the inverted sleep signal SLPB being a logic high and the sleep control signal SLP being a logic low, the second latch transistors MP3, MN3 are turned off. Thus, the data latch node N2 may not be electrically coupled to the data retaining node N3 through the second latch transistor MP3, MN3. While the memory cell 125 is in the sleep state, in response to the inverted sleep signal SLPB being a logic low and the sleep control signal SLP being a logic high, the second latch transistors MP3, MN3 are turned on. Thus, the data latch node N2 may be electrically coupled to the data retaining node N3 through the second latch transistors MP3, MN3. In this manner, while the memory cell 125 is in the sleep state, the last read data from the memory cell 125 may be still latched at the data latch node N2 by the second latch transistors MP3, MN3.

Therefore, after the power wakeup, the last read data latched at the data latch node N2 may be directly transferred to the data sensing node N1 by the transferring transistors MP1, MN1. In other words, in response to the memory cell 125 being transitioned from the sleep state to the operational state, the transferring transistors MP1, MN1 may be configured to transfer the data from the data latch node N2 to the data sensing node N1. That is, there is no need to write the last read data into a NVM and then read the last read data from the NVM after the power wakeup, thereby decreasing the power consumption and also increasing the efficiency.

Figure 5A:
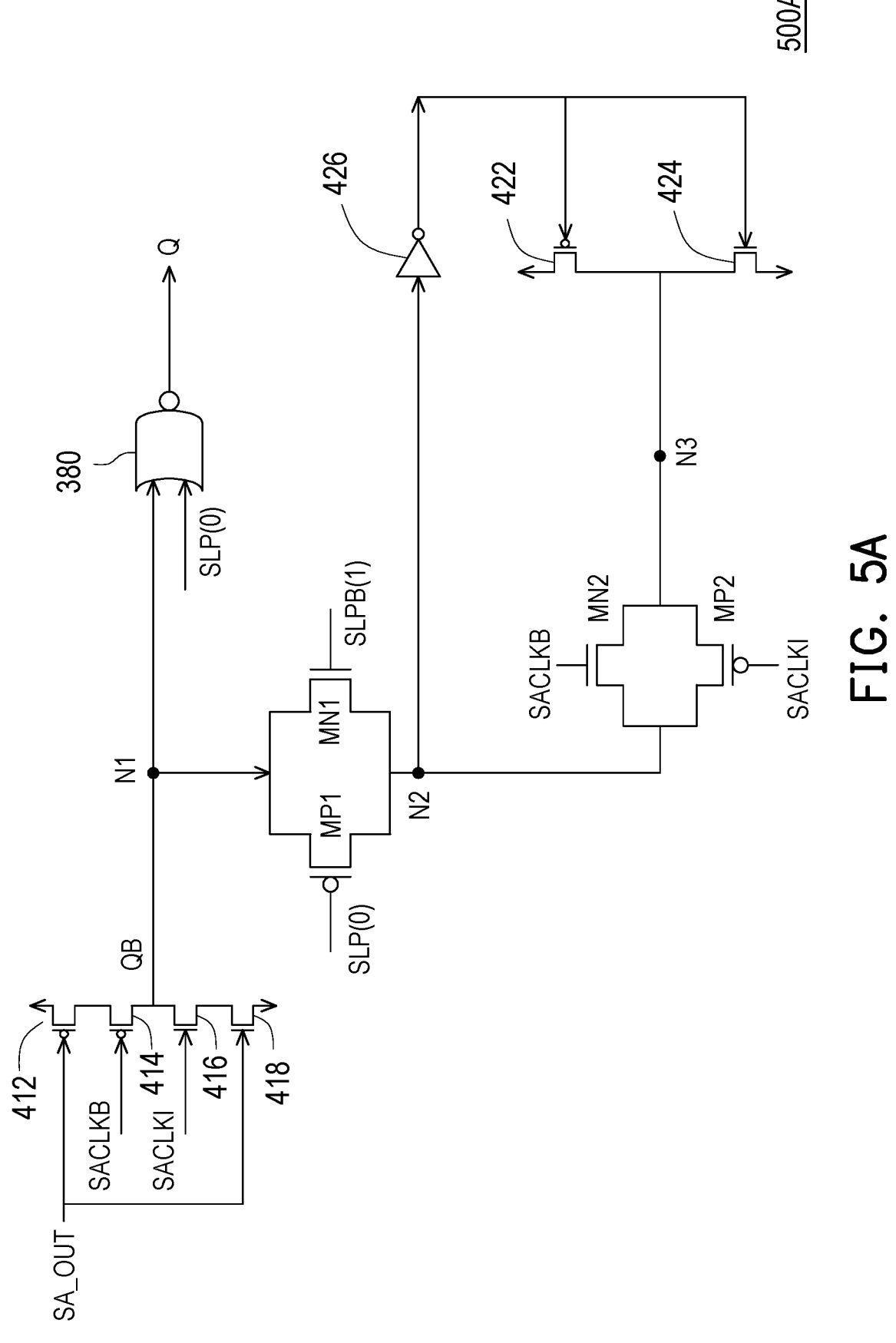
FIG. 5A is a schematic block diagram of an output latch and an output circuit of memory device in an operational state according to an embodiment of the disclosure.
Figure 5B:
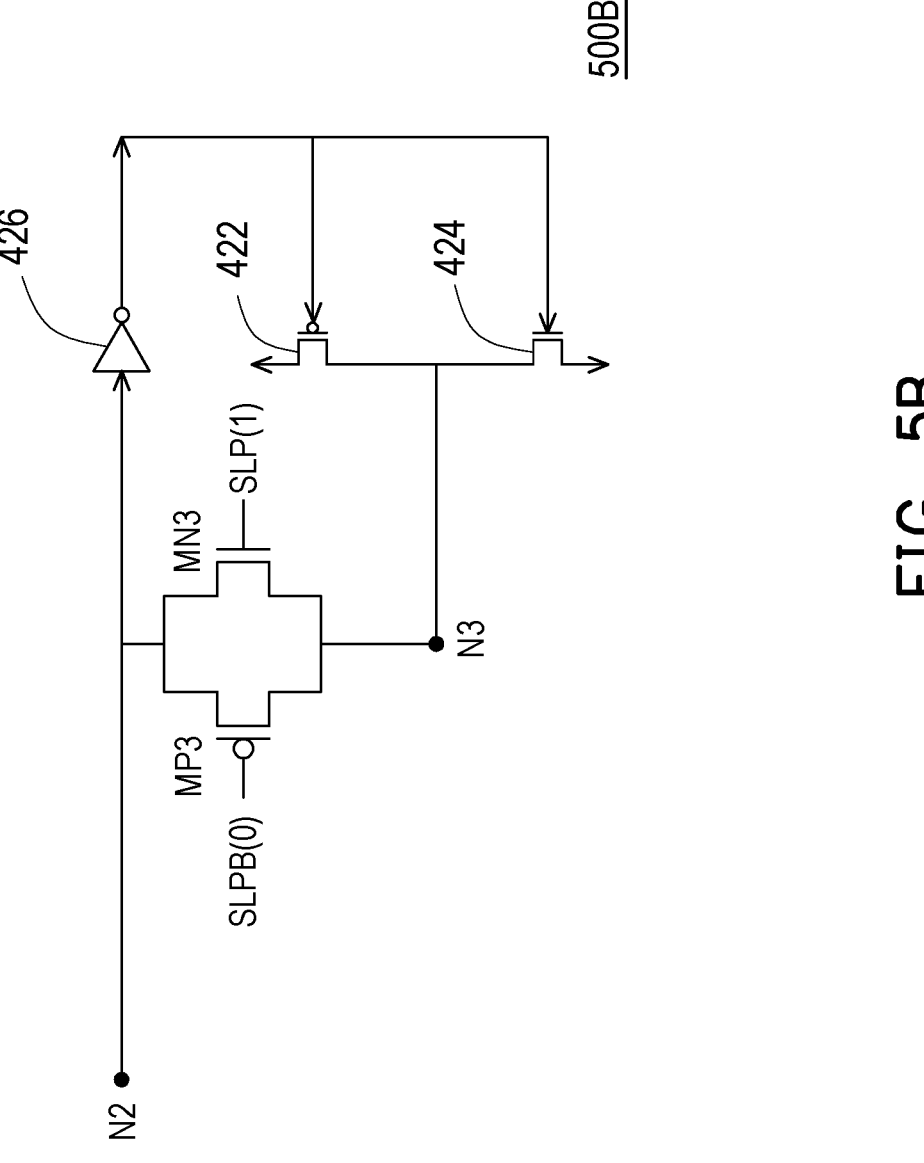
FIG. 5B is a schematic block diagram of an output latch and an output circuit of memory device in a sleep state according to an embodiment of the disclosure.

FIG. 5A is a schematic block diagram of an output latch and an output circuit of memory device in an operational state according to an embodiment of the disclosure. FIG. 5B is a schematic block diagram of an output latch and an output circuit of memory device in a sleep state according to an embodiment of the disclosure. Referring to FIG. 1 to FIG. 5B, the circuit 500A may be an exemplary embodiment of the circuit 400 in an operational state and the circuit 500B may be an exemplary embodiment of the circuit 400 in a sleep state.

Referring to FIG. 5A, while the memory device 200 is in an operational state, the transferring transistors MP1, MN1 are turned on and the second latch transistors MP3, MN3 are turned off. For the sake of convenience of explanation, the second latch transistors MP3, MN3 are removed in FIG. 5A.

As shown in FIG. 5A, while the memory device 200 is in the operational state, the sleep control signal SLP may be at a logic low (e.g., "0") and the inverted sleep signal SLPB may be at a logic high (e.g., "1"). In this configuration, the transferring transistors MP1, MN1 may be operative to receive the data read from the memory cell 125 at the data sensing node N1. Further, the transferring transistors MP1, MN1 may be operative to transfer from the data sensing node N1 to the data latch node N2 or to transfer the data from the data latch node N2 to the data sensing node N1. Furthermore, the first latch transistors MP2, MN2 may be operative to latch the data transferred from the data sensing node N1 at the data latch node N2 and the data retaining node N3. In this manner, while the memory cell 125 is in the operational state, the data from the memory cell 125 may be latched at the data latch node N2 by the first latch transistors MP2, MN2.

Referring to FIG. 5B, while the memory device 200 is in a sleep state, the transferring transistors MP1, MN1 are turned off, the first latch transistors MP2, MN2 are turned off, and the second latch transistors MP3, MN3 are turned on. For the sake of convenience of explanation, the transferring transistors MP1, MN1, the first latch transistors MP2, MN2, the data sensing transistors 412, 414, 416, 418, and the output circuit 380 are removed in FIG. 5B.

As shown in FIG. 5B, while the memory device 200 is in the sleep state, the sleep control signal SLP may be at a logic high (e.g., "1") and the inverted sleep signal SLPB may be at a logic low (e.g., "0"). In this configuration, the second latch transistors MP3, MN3 may be operative to latch the data transferred from the data sensing node N1 at the data latch node N2 and the data retaining node N3. In this manner, while the memory cell 125 is in the operational state, the data from the memory cell 125 may be still latched at the data latch node N2 by the second latch transistors MP3, MN3.

Therefore, after the power wakeup, the last read data latched at the data latch node N2 may be directly transferred to the data sensing node N1 by the transferring transistors MP1, MN1. In other words, in response to the memory cell 125 being transitioned from the sleep state to the operational state, the transferring transistors MP1, MN1 may be configured to transfer the data from the data latch node N2 to the data sensing node N1. That is, there is no need to write the last read data into a NVM and then read the last read data from the NVM after the power wakeup, thereby decreasing the power consumption and also increasing the efficiency.

FIG. 6 is a schematic flowchart of a data latching method according to an embodiment of the disclosure. Referring to FIG. 1 to FIG. 6, a data latching method 600 may include a step S610, a step S620, a step S630, and a step S640.

In the step S610, the data may be transferred from the data sensing node N1 of the memory cell 125 to the data latch node N2 by the transferring transistors MP1, MN1 (also known as a first set of transistors), in response to the memory cell 125 being in an operational state.

In the step S620, the data at the data latch node N2 may be latched by the first latch transistors MP2, MN2 (also known as a second set of transistors), in response to the memory cell 125 being in the operational state.

In the step S630, the data at the data latch node N2 may be latched by the second latch transistors MN3, MP3 (also known as a third set of transistors), in response to the memory cell 125 being in the sleep state.

In the step S640, the data may be transferred from the data latch node to the data sensing node of the memory cell by the transferring transistors MP1, MN1, in response to the memory cell 125 being transitioned from the sleep state to the operational state.

In addition, the implementation details of the data latching method 600 may be referred to the descriptions of FIG. 1 to FIG. 5B to obtain sufficient teachings, suggestions, and implementation embodiments, while the details are not redundantly described seriatim herein.

In this manner, while the memory cell 125 is in the sleep state, the last read data from the memory cell 125 may be still latched at the data latch node N2 by the second latch transistors MP3, MN3.

Therefore, after the power wakeup, the last read data latched at the data latch node N2 may be directly transferred to the data sensing node N1 by the transferring transistors MP1, MN1. In other words, in response to the memory cell 125 being transitioned from the sleep state to the operational state, the transferring transistors MP1, MN1 may be configured to transfer the data from the data latch node N2 to the data sensing node N1. That is, there is no need to write the last read data into a NVM and then read the last read data from the NVM after the power wakeup, thereby decreasing the power consumption and also increasing the efficiency.

In summary, according to the memory device 100, 200 and the data latching method 600, while the memory cell 125 is in the sleep state, the last read data from the memory cell 125 may be still latched at the data latch node N2 by the second latch transistors MP3, MN3. Thus, there is no need to write the last read data into a NVM and then read the last read data from the NVM after the power wakeup, thereby decreasing the power consumption and also increasing the efficiency.

In one embodiment, the memory device includes a memory cell and an output latch. The memory cell is configured to store data and operate in an operational state or a sleep state. The output latch is coupled to a data sensing node of the memory cell. The output latch includes a first set of transistors, a second set of transistors, and a third set of transistors. The first set of transistors is configured to transfer data from the data sensing node of the memory cell to a data latch node, in response to the memory cell being in the operational state. The second set of transistors is configured to latch the data at the data latch node, in response to the memory cell being in the operational state. The third set of transistors is configured to latch the data at the data latch node, in response to the memory cell being in the sleep state. The first set of transistors is further configured to transfer the data from the data latch node to the data sensing node of the memory cell, in response to the memory cell being transitioned from the sleep state to the operational state.

In a related embodiment, the data sensing node is disposed between the memory cell and the first set of transistors.

In a related embodiment, the data latch node is disposed between the first set of transistors and the second set of transistors and between the first set of transistors and the third set of transistors.

In a related embodiment, a data retaining node is disposed between the second set of transistors and the third set of transistors In a related embodiment, in response to the memory cell being in the sleep state, the first set of transistors are turned off, the second set of transistors are turned off, and the third set of transistors are turned on.

In a related embodiment, in response to the memory cell being in the operational state, the first set of transistors are turned on and the third set of transistors are turned off.

In a related embodiment, in response to the memory cell being in the operational state, the second set of transistors are turned on or off according to a clock signal of a sense amplifier coupled to the memory cell.

In a related embodiment, the memory device is configured to receive a sleep control signal indicating that the memory cell is in the operational state or the memory cell is in the sleep state.

In a related embodiment, at least one gate electrode of the first set of transistors is configured to receive a sleep control signal indicating that the memory cell is in the operational state or the memory cell is in the sleep state.

In a related embodiment, source electrodes of the first set of transistors are configured to receive an output data signal from the memory cell as the data.

In a related embodiment, drain electrodes of the first set of transistors are coupled to source electrodes of the second set of transistors and source electrodes of the third set of transistors.

In a related embodiment, drain electrodes of the second set of transistors are coupled to the drain electrodes of the third set of transistors.

In a related embodiment, the output latch further includes a fourth set of transistors. The fourth set of transistors is coupled to a sense amplifier coupled to the memory cell and configured to receive an output data signal through the sense amplifier from the memory cell as the data.

In one embodiment, the memory device includes a memory cell and an output latch. The memory cell is configured to store data. The output latch is coupled to a data sensing node of the memory cell and configured to receive data from the memory cell. The output latch is configured to: receive a sleep control signal indicating whether the memory cell is in a sleep state or in an operational state; and transfer the data from a data latch node of the output latch to the data sensing node of the memory cell, in response to the sleep control signal indicating that the memory cell is being transitioned from the sleep state to the operational state.

In a related embodiment, the output latch includes a first set of transistors, a second set of transistors, and a third set of transistors. The first set of transistors is configured to transfer the data from the data sensing node of the memory cell to the data latch node, in response to the sleep control signal indicating that the memory cell is in the operational state. The second set of transistors is configured to latch the data at the data latch node, in response to the sleep control signal indicating that the memory cell is in the operational state. The third set of transistors is configured to latch the data at the data latch node, in response to the sleep control signal indicating that the memory cell is in the sleep state. The first set of transistors is further configured to transfer the data from the data latch node to the data sensing node of the memory cell, in response to the sleep control signal indicating that the memory cell is being transitioned from the sleep state to the operational state.

In a related embodiment, the data sensing node is disposed between the memory and the first set of transistors.

In a related embodiment, the data latch node is disposed between the first set of transistors and the second set of transistors and between the first set of transistors and the third set of transistors.

In a related embodiment, in response to the sleep control signal indicating that the memory cell is in the sleep state, the first set of transistors are turned off, the second set of transistors are turned off, and the third set of transistors are turned on.

In a related embodiment, in response to the sleep control signal indicating that the memory cell is in the operational state, the first set of transistors are turned on and the third set of transistors are turned off.

In one embodiment, the data latching method includes: transferring, by a first set of transistors, data from a data sensing node of a memory cell to a data latch node, in response to the memory cell being in an operational state; latching, by a second set of transistors, the data at the data latch node, in response to the memory cell being in the operational state; latching, by a third set of transistors, the data at the data latch node, in response to the memory cell being in a sleep state; and transferring by the first set of transistors, the data from the data latch node to the data sensing node of the memory cell, in response to the memory cell being transitioned from the sleep state to the operational state.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device comprising:

a memory cell, configured to store data and operate in an operational state or a sleep state;

an output latch, coupled to a data sensing node of the memory cell, wherein the output latch comprises:

a first set of transistors, configured to transfer the data from the data sensing node of the memory cell to a data latch node, in response to the memory cell being in the operational state;

a second set of transistors, configured to latch the data at the data latch node and latch inverted data of the data at a data retaining node based on a sleep control signal, in response to the memory cell being in the operational state; and a third set of transistors, configured to latch the data at the data latch node and latch the inverted data at the data retaining node based on the sleep control signal, in response to the memory cell being in the sleep state; and an output circuit, coupled to the data sensing node and configured to:

generate an output data signal indicating the data stored in the memory cell based on the sleep control signal, in response to the memory cell being in the operational state; and generate the output data signal having a predetermined voltage based on the sleep control signal, in response to the memory cell being in the sleep state, wherein the first set of transistors is further configured to transfer the data from the data latch node to the data sensing node of the memory cell, in response to the memory cell being transitioned from the sleep state to the operational state, one end of the second set of transistors is coupled to the data latch node, and another end of the second set of transistors is coupled to the data retaining node, and one end of the third set of transistors is coupled to the data latch node, and another end of the third set of transistors is coupled to the data retaining node.

2. The memory device according to claim 1, wherein the data sensing node is disposed between the memory cell and the first set of transistors.

3. The memory device according to claim 1, wherein the data latch node is disposed between the first set of transistors and the second set of transistors and between the first set of transistors and the third set of transistors.

4. The memory device according to claim 1, wherein the data retaining node is disposed between the second set of transistors and the third set of transistors and an inverter is coupled between the data retaining node and the data latch node.

5. The memory device according to claim 1, wherein in response to the memory cell being in the sleep state, the first set of transistors are turned off, the second set of transistors are turned off, and the third set of transistors are turned on.

6. The memory device according to claim 1, wherein in response to the memory cell being in the operational state, the first set of transistors are turned on and the third set of transistors are turned off.

7. The memory device according to claim 6, wherein in response to the memory cell being in the operational state, the second set of transistors are turned on or off according to a clock signal of a sense amplifier coupled to the memory cell.

8. The memory device according to claim 1, wherein the memory device is configured to receive the sleep control signal indicating that the memory cell is in the operational state or the memory cell is in the sleep state.

9. The memory device according to claim 1, wherein at least one gate electrode of the first set of transistors is configured to receive the sleep control signal indicating that the memory cell is in the operational state or the memory cell is in the sleep state.

10. The memory device according to claim 1, wherein source electrodes of the first set of transistors are configured to receive the output data signal from the memory cell as the data.

11. The memory device according to claim 1, wherein drain electrodes of the first set of transistors are coupled to source electrodes of the second set of transistors and source electrodes of the third set of transistors.

12. The memory device according to claim 1, wherein drain electrodes of the second set of transistors are coupled to the drain electrodes of the third set of transistors.

13. The memory device according to claim 1, wherein the output latch further comprises:

a fourth set of transistors, coupled to a sense amplifier coupled to the memory cell and configured to receive the output data signal through the sense amplifier from the memory cell as the data.

14. A memory device comprising:

a memory cell, configured to store data;

an output latch, coupled to a data sensing node of the memory cell and configured to receive data from the memory cell, wherein the output latch is configured to:

receive a sleep control signal indicating whether the memory cell is in a sleep state or in an operational state;

latch, by a first latch, the data at a data latch node and inverted data of the data at a data retaining node based on the sleep control signal in the operational state;

latch, by a second latch, the data at the data latch node and the inverted data at the data retaining node based on the sleep control signal in the sleep state; and transfer the data from the data latch node of the output latch to the data sensing node of the memory cell, in response to the sleep control signal indicating that the memory cell is being transitioned from the sleep state to the operational state; and an output circuit, coupled to the data sensing node and configured to:

generate an output data signal indicating the data stored in the memory cell based on the sleep control signal in the operational state; and generate the output data signal having a predetermined voltage based on the sleep control signal in the sleep state, wherein one end of the first latch is coupled to the data latch node, and another end of the first latch is coupled to the data retaining node, and one end of the second latch is coupled to the data latch node, and another end of the second latch is coupled to the data retaining node.

15. The memory device according to claim 14, wherein the output latch comprises:

a first set of transistors, configured to transfer the data from the data sensing node of the memory cell to the data latch node, in response to the sleep control signal indicating that the memory cell is in the operational state;

a second set of transistors, as the first latch, configured to latch the data at the data latch node and latch the inverted data the data retaining node, in response to the sleep control signal indicating that the memory cell is in the operational state; and a third set of transistors, as the second latch, configured to latch the data at the data latch node and latch the inverted data the data retaining node, in response to the sleep control signal indicating that the memory cell is in the sleep state, wherein the first set of transistors is further configured to transfer the data from the data latch node to the data sensing node of the memory cell, in response to the sleep control signal indicating that the memory cell is being transitioned from the sleep state to the operational state.

16. The memory device according to claim 15, wherein the data sensing node is disposed between the memory and the first set of transistors.

17. The memory device according to claim 15, wherein the data latch node is disposed between the first set of transistors and the second set of transistors and between the first set of transistors and the third set of transistors.

18. The memory device according to claim 15, wherein in response to the sleep control signal indicating that the memory cell is in the sleep state, the first set of transistors are turned off, the second set of transistors are turned off, and the third set of transistors are turned on.

19. The memory device according to claim 15, wherein in response to the sleep control signal indicating that the memory cell is in the operational state, the first set of transistors are turned on and the third set of transistors are turned off.

20. A data latching method, comprising:

transferring, by a first set of transistors, data from a data sensing node of a memory cell to a data latch node, in response to the memory cell being in an operational state;

latching, by a second set of transistors, the data at the data latch node and inverted data of the data at a data retaining node based on a sleep control signal, in response to the memory cell being in the operational state;

generating an output data signal indicating the data stored in the memory cell based on the sleep control signal, in response to the memory cell being in the operational state;

latching, by a third set of transistors, the data at the data latch node and the inverted data at the data retaining node based on the sleep control signal, in response to the memory cell being in a sleep state;

generating the output data signal having a predetermined voltage based on the sleep control signal, in response to the memory cell being in the sleep state; and transferring by the first set of transistors, the data from the data latch node to the data sensing node of the memory cell, in response to the memory cell being transitioned from the sleep state to the operational state, wherein one end of the second set of transistors is coupled to the data latch node, and another end of the second set of transistors is coupled to the data retaining node, and one end of the third set of transistors is coupled to the data latch node, and another end of the third set of transistors is coupled to the data retaining node.

\* \* \* \* \*